United States Patent
Chung

(10) Patent No.: US 7,385,852 B2
(45) Date of Patent: Jun. 10, 2008

(54) CIRCUIT FOR GENERATING STEP-UP VOLTAGE IN NON-VOLATILE MEMORY DEVICE

(75) Inventor: Sang Hwa Chung, Icheon-si (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 127 days.

(21) Appl. No.: 11/477,568

(22) Filed: Jun. 30, 2006

(65) Prior Publication Data

US 2007/0047322 A1    Mar. 1, 2007

(30) Foreign Application Priority Data

Aug. 25, 2005  (KR) .................... 10-2005-0078275

(51) Int. Cl.
G11C 11/34    (2006.01)
(52) U.S. Cl. ............................. 365/185.23; 365/189.09
(58) Field of Classification Search ........... 365/189.11, 365/189.09, 185.18, 185.23
See application file for complete search history.

(56) References Cited

U.S. PATENT DOCUMENTS

| | | | |
|---|---|---|---|
| 5,473,277 A * | 12/1995 | Furumochi ................. | 327/543 |
| 5,936,906 A * | 8/1999 | Tsen ..................... | 365/210.13 |
| 6,046,954 A * | 4/2000 | Yoon et al. ............... | 365/226 |
| 7,072,238 B2 * | 7/2006 | Chae et al. .............. | 365/226 |
| 2004/0004876 A1* | 1/2004 | Choi et al. ............... | 365/202 |
| 2006/0056264 A1* | 3/2006 | Worley et al. ......... | 365/230.06 |
| 2006/0132114 A1* | 6/2006 | Giduturi et al. .......... | 323/313 |

FOREIGN PATENT DOCUMENTS

| | | |
|---|---|---|
| JP | 10-208489 | 8/1998 |
| JP | 11-134892 | 5/1999 |
| KR | 1020050041191 | 5/2005 |
| KR | 1020060062812 | 6/2006 |

OTHER PUBLICATIONS

Kang-Deog et al., A 3.3 V 32 Mb NAND Flash Memory with Incremental Step Pulse Programming Scheme, 1995, IEEE Journal of Solid-State Circuits, vol. 30, No. 11, Nov. 1995, pp. 1149-1155.*
Notice of Allowance for KR 2005-78275.

* cited by examiner

*Primary Examiner*—Huan Hoang
*Assistant Examiner*—Jay Radke
(74) *Attorney, Agent, or Firm*—Lowe Hauptman Ham & Berner LLP

(57) ABSTRACT

A circuit for generating a step-up voltage, in which it can reduce ripples. The circuit includes a high voltage transfer switch, a high voltage switching unit that pumps a high voltage in response to a clock signal and switches the high voltage transfer switch, a high voltage switching controller, which compares a feedback voltage generated by dividing an output signal of the high voltage transfer switch and a variable reference voltage, generates an internal clock signal using the comparison result and the clock signal, and controls the switching of the high voltage transfer switch in response to the comparison result, and a step-up voltage generator that pumps the high voltage in response to the internal clock signal and a plurality of step-up reference voltages and generates an internal step-up voltage. The high voltage transfer switch outputs the internal step-up voltage in response to the output signal of the high voltage switching unit.

9 Claims, 3 Drawing Sheets

CIRCUIT FOR GENERATING STEP-UP VOLTAGE IN NON-VOLATILE MEMORY DEVICE

BACKGROUND

1. Field of the Invention

The present invention relates to a circuit for generating a step-up voltage in a non-volatile memory device. More particularly, to a circuit for generating a step-up voltage necessary upon Incremental Step Pulse Programming (ISPP).

2. Discussion of Related Art

Non volatile memory devices, such as a flash memory or EEPROM devices, require a step-up voltage whose voltage level gradually rises upon ISPP. The step-up voltage is internally generated using a voltage higher than an external power supply voltage.

FIG. 1 is a circuit for implementing ISPP employing an externally applied high voltage 25V. It is assumed that the ISPP specification ranges from 16.5V to 21V and a step voltage (STEP) is 0.5V.

Referring to FIG. 1, if an enable signal (EN) is enabled, the external high voltage 25V is output to an output terminal Vout. At this time, to implement the ISPP method, step-up reference voltages (TISPP<7:0>; which may be extended or shortened depending on a step number) are activated from TISPP<0> to TISPP<7> at given intervals. Voltages V0 to V7, which are obtained by dividing the step-up voltage of the output terminal Vout using resistors R1 to R9, are feedback voltages. The voltages V0 to V7 are input to a comparator 11 through NMOS transistors N1 to N8 driven by the step-up reference voltages (TISPP<7:0>), respectively.

The comparator 11 outputs the output signal (Vcom) as a logical low if the level of the feedback voltages V0 to V7 is higher than that of a bandgap reference voltage (Vbg), which is set to 1V. A NOR gate NR1 performs a NOR operation on the output signal (Vcom) of a logical low and an output signal of an inverter IV1 of a logical low, and makes a node LEAK a logical high. A NAND gate ND1 performs a NAND operation on a clock signal (CLK) and the output signal (Vcom) of a logical low and fixes an internal clock signal (CLK1) to a logical high.

At this time, a high voltage switching unit 12 stops the operation of pumping a high voltage (VPP) using the internal clock signal (CLK1) fixed to a logical high. NMOS transistors N11 to N16 are all turned on to connect a driving node SEL of a high voltage NMOS transistor N10 to the ground (VSS). In this case, the high voltage NMOS transistor N10 is turned off, so that a step-up voltage level of the output terminal Vout is lowered.

Meanwhile, if the level of the feedback voltage (V0 to V7) is lower than that of the bandgap reference voltage (Vbg), which is set to 1V), the comparator 11 outputs the output signal (Vcom) as a logical high. The NOR gate NR1 then performs a NOR operation on the output signal (Vcom) of a logical high and the output signal of the inverter IV1, of a logical low, and makes a node LEAK a logical low. The NAND gate ND1 performs a NAND operation on the output signal (Vcom) of a logical high and the clock signal (CLK), and toggles the internal clock signal (CLK1).

At this time, the high voltage switching unit 12 pumps the high voltage (VPP) according to the toggled internal clock signal (CLK1). The NMOS transistor N16 is turned off and accordingly does not connect the ground (VSS) to the driving node SEL. If so, the high voltage NMOS transistor N10 is turned on so that the step-up voltage level of the output terminal Vout rises.

However, the step-up voltage generating circuit constructed above generates a very high voltage of 25V to a minimum 16.5V without any filtering unit. Accordingly, a very great ripple is generated due to the high voltage of 25V. This makes it difficult to implement ISPP.

SUMMARY OF THE INVENTION

An embodiment of the present invention relates to a circuit for generating a step-up voltage, in which it can reduce the ripple of a step-up voltage that gradually rises.

A circuit for generating a step-up voltage of a non-volatile memory device, according to an embodiment of the present invention, includes a high voltage transfer switch, a high voltage switching unit that pumps a high voltage in response to a clock signal and switches the high voltage transfer switch, a high voltage switching controller, which compares a feedback voltage to a variable reference voltage generated by dividing an output signal of the high voltage transfer switch, generates an internal clock signal using the comparison result and the clock signal, and controls the switching of the high voltage transfer switch in response to the comparison result, and a step-up voltage generator that pumps the high voltage in response to the internal clock signal and a plurality of step-up reference voltages and generates an internal step-up voltage. The high voltage transfer switch outputs the internal step-up voltage in response to the output signal of the high voltage switching unit.

BRIEF DESCRIPTION OF THE DRAWINGS

A more compete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

Figure 1:
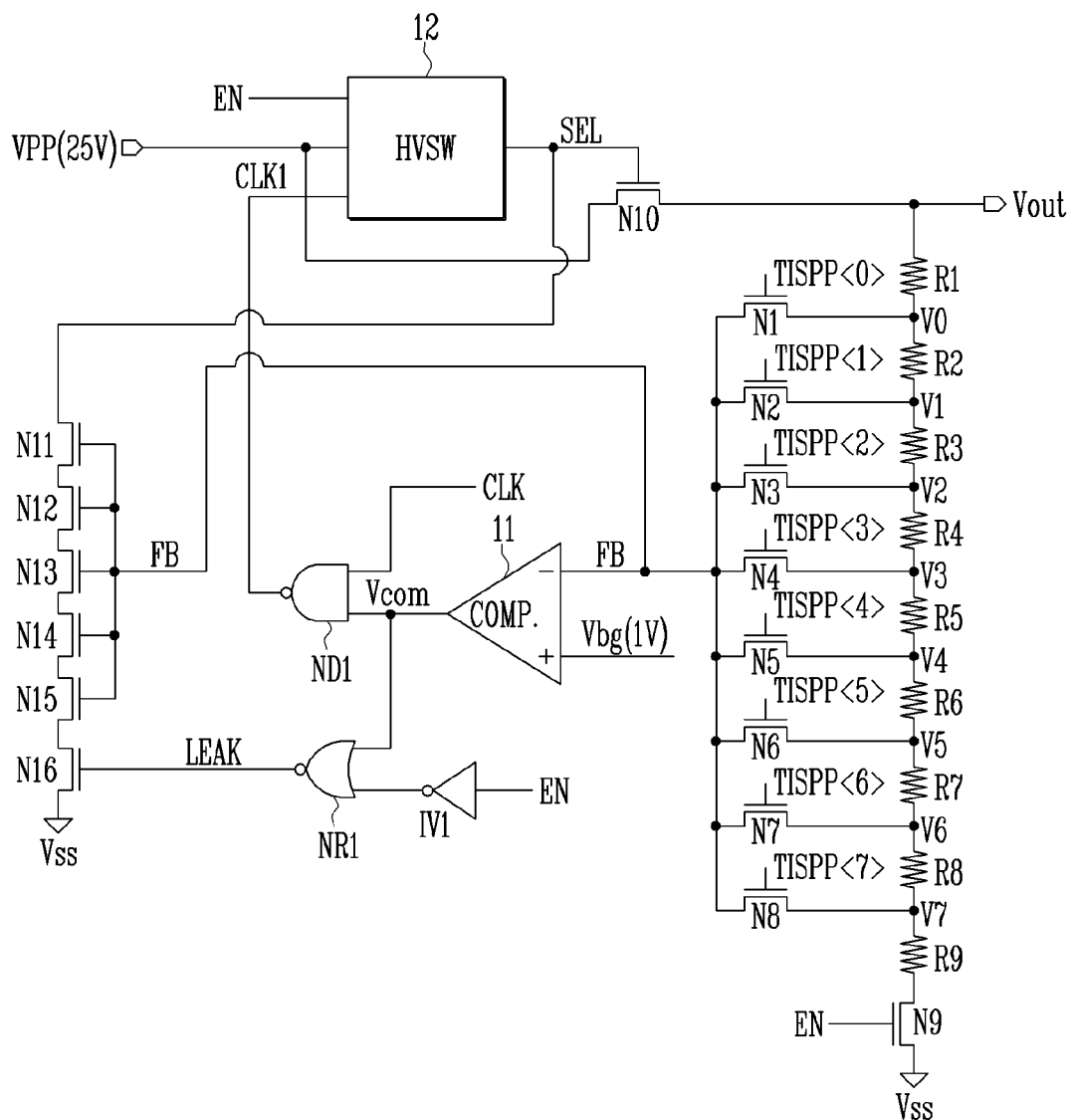
FIG. 1 is a circuit diagram of a circuit for generating a step-up voltage in the related art.

In the following detailed description, only certain exemplary embodiments of the present invention have been shown and described simply by way of illustration. As those skilled in the art will realize, the described embodiments may be modified in various different ways, all without departing from the spirit or scope of the present invention. Accordingly, the drawings and description are to be regarded as illustrative in nature and not restrictive. Like reference numerals designate like elements throughout.

Figure 2:
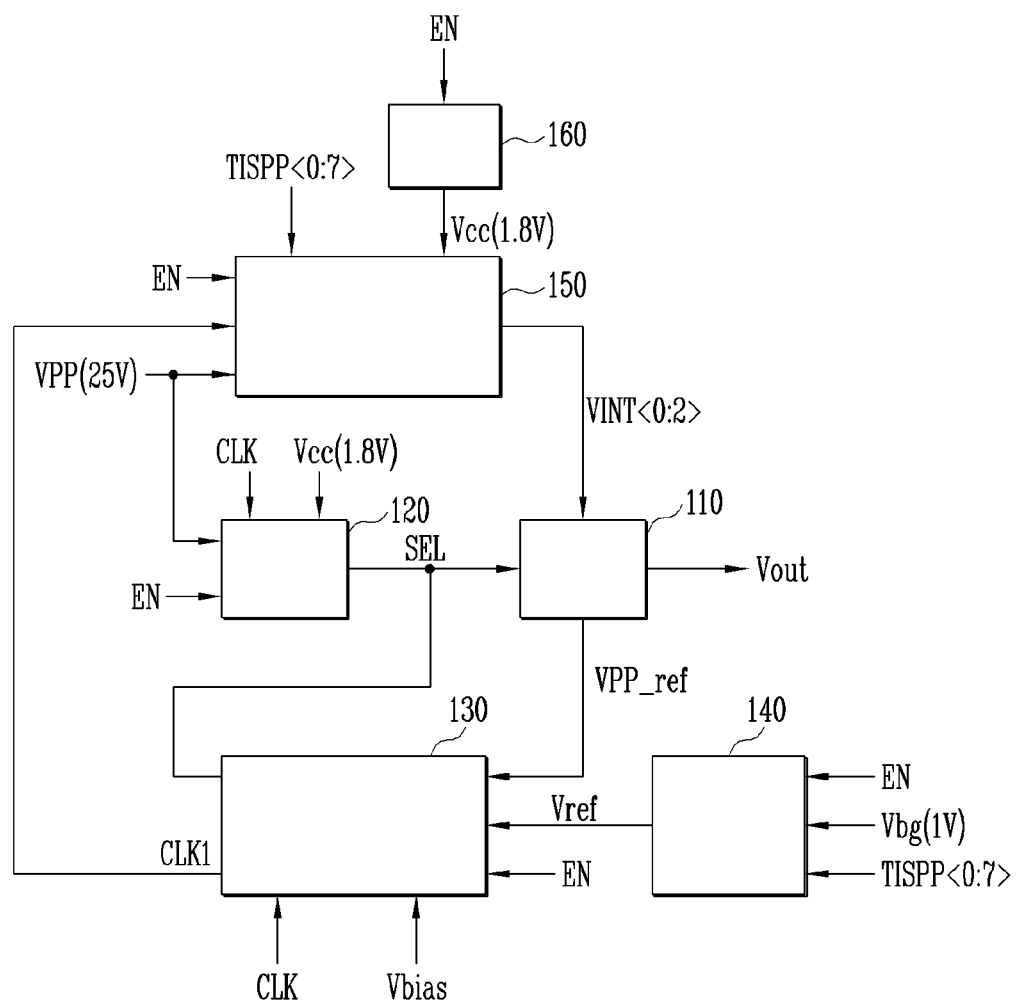
FIG. 2 is a circuit diagram of a circuit for generating a step-up voltage according to an embodiment of the present invention.

FIG. 2 is a circuit diagram of a circuit for generating a step-up voltage according to an embodiment of the present invention.

Referring to FIG. 2, the step-up voltage generating circuit includes a high voltage transfer switch 110, a high voltage switching unit 120, a high voltage switching controller 130, a variable reference voltage generator 140, a step-up voltage generator 150, and a voltage drop unit 160.

The high voltage transfer switch 110 outputs internal step-up voltages (VINT<0:2>), which are generated from the step-up voltage generator 150, to an output terminal Vout under the control of the high voltage switching unit 120 and the high voltage switching controller 130.

The high voltage switching unit 120 pumps a high voltage (VPP) when a clock signal (CLK) is toggled, and steps up the voltage level of a driving node SEL of the high voltage transfer switch 110. At this time, to limit the pumping level of the high voltage (VPP), a voltage of 1.8V may be used as a power supply voltage.

The high voltage switching controller 130 compares a feedback voltage (Vpp_ref), which is generated by dividing a voltage of the output terminal Vout, and a variable reference voltage (Vref), connects or disconnects the driving node SEL and the ground (VSS) according to the comparison result, and combines a clock signal (CLK) to generate an internal clock signal (CLK1).

The variable reference voltage generator 140 generates the variable reference voltage (Vref) employing a bandgap reference voltage (Vbg=1V) and step-up reference voltages (TISPP<0:7>). The step-up reference voltages (TISPP<0:7>) are reference voltages for generating internal step-up voltages (VINT<0:2>). The variable reference voltage (Vref) eliminates varying factors of a resistance value of the feedback voltage (Vpp_ref) for a stable operation.

The step-up voltage generator 150 pumps the high voltage (VPP) in response to the step-up reference voltages (TISPP<0:7>) when the internal clock signal (CLK1) is toggled, generating the internal step-up voltages (VINT<0:2>). At this time, to limit the pumping level of the high voltage (VPP), a voltage of 1.8V may be used as a power supply voltage.

The voltage drop unit 160 divides a power supply voltage (for example, approximately 3.3V) to generate a voltage (for example 1.8V) used for the high voltage switching unit 120 and the step-up voltage generator 150.

Figure 3:
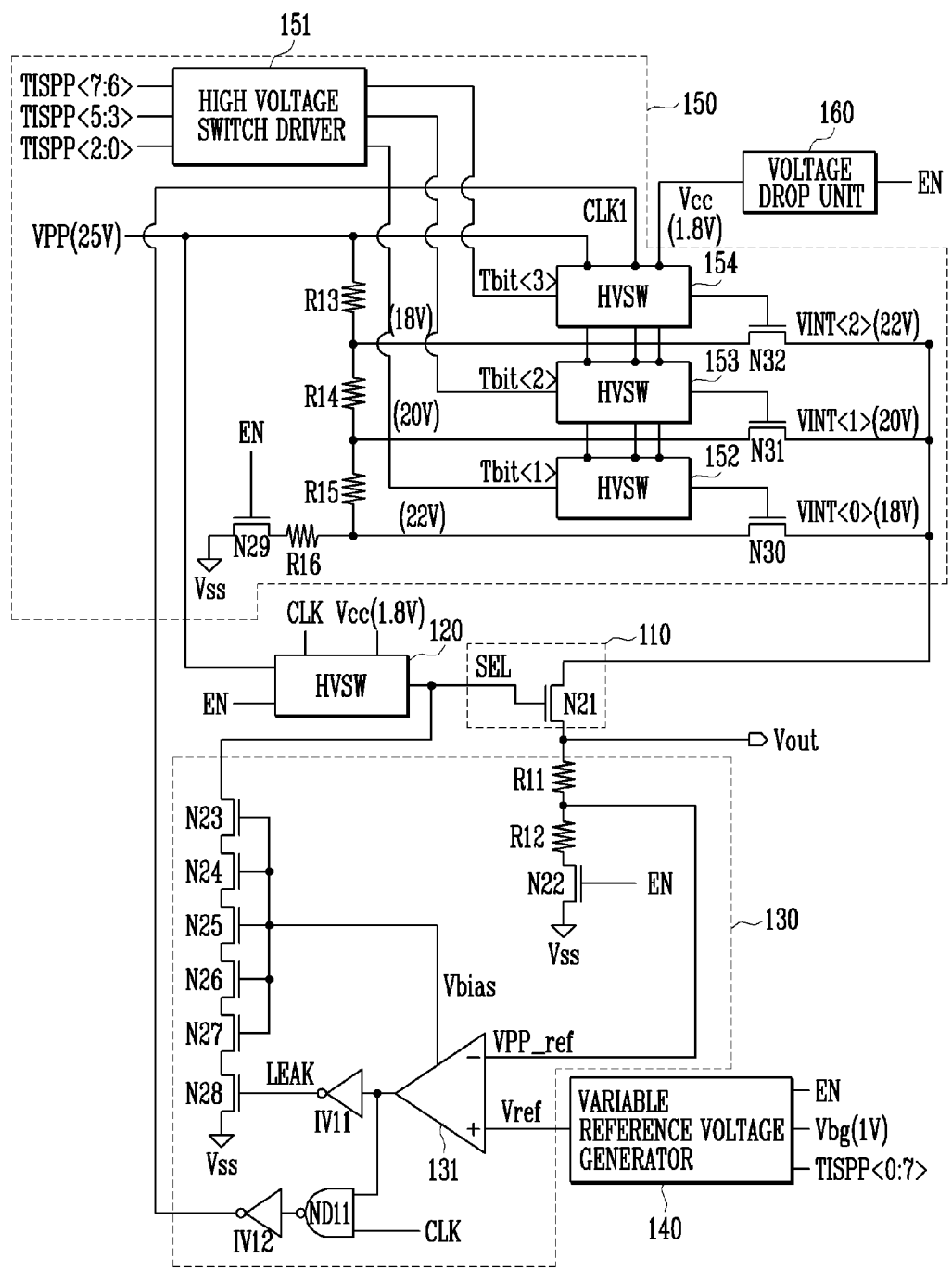
FIG. 3 is a detailed circuit diagram of the step-up voltage generating circuit shown in FIG. 2.

FIG. 3 is a detailed circuit diagram of the step-up voltage generating circuit shown in FIG. 2.

Referring to FIG. 3, the high voltage transfer switch 110 includes a high voltage NMOS transistor N21 having a gate to which a signal of the driving node SEL is input.

The high voltage switching controller 130 includes resistors R11, R12, an NMOS transistor N22, a comparator 131, inverters IV11, IV12, a NAND gate ND11, and NMOS transistors N23 to N28.

The resistors R11, R12 and the NMOS transistor N22 are sequentially connected in series between the output terminal Vout and the ground (VSS). The NMOS transistor N22 has a gate to which an enable signal (EN) is input. At this time, if the NMOS transistor N22 is turned on, the resistors R11, R12 divide the step-up voltage of the output terminal Vout.

The voltage divider comprising the resistors R11 and R12 divides the output voltage (Vout) and outputs the feedback voltage (Vpp_ref). The comparator 131 compares the feedback voltage (Vpp_ref) to the variable reference voltage (Vref) and outputs the comparison result. The inverter IV11 inverts and outputs an output signal of the comparator 131.

The NAND gate ND11 performs a NAND operation on the output signal of the comparator 131 and the clock signal (CLK) and outputs the operation result. The inverter IV12 inverts and outputs the output signal of the NAND gate ND11.

The NMOS transistors N23 to N28 are sequentially connected in series between the driving node SEL and the ground (VSS). The NMOS transistors N23 to N27 have gates to which a voltage (Vbias) of less than 1V, which is generated from the comparator 131. The NMOS transistor N28 has a gate to which the output signal of the inverter IV11 is input. If the NMOS the transistors N23 to N27 are turned on according to the voltage (Vbias) of less than 1V as described above unlike the related art, the voltage of the driving node SEL is discharged to the ground (VSS) slowly in comparison with the related art, thus preventing an abrupt level shift of the driving node SEL.

The step-up voltage generator 150 includes a high voltage switch driver 151, high voltage switching units 152 to 154, resistors R13 to R15, and NMOS transistors N29 to N32.

The high voltage switching driver 151 receives a plurality of the step-up reference voltages (TISPP<0:7>) and generates high voltage switching control signals (Tbit<1:3>).

The resistors R13 to R16 and the NMOS transistor N29 are sequentially connected in series between a terminal to which the high voltage (VPP) is input and the ground (VSS). The resistors R13 to R16 divide the high voltage (VPP) if the NMOS transistor N29 has its gate applied with the enable signal (EN) and is thus turned on, and generates the divided voltages 18V, 20V, and 22V.

The high voltage switching units 152 to 154 pump the high voltage (VPP) in response to the high voltage switching control signals (Tbit<1:3>), respectively, when the internal clock signal (CLK1) is toggled. At this time, the high voltage switching units 152 to 154 are supplied with a voltage of 1.8V as a power supply voltage, and limits the pumping level of the high voltage (VPP).

The high voltage NMOS transistors N30, N31, and N32 output the divided voltages 18V, 20V, and 22V as the step-up voltages (VINT<0:2>), respectively, in response to the output signals of the high voltage switching units 152 to 154.

The operation of the step-up voltage generating circuit will be described in more detail with reference to FIG. 3.

If the internal step-up voltage (VINT<0>; 16.5V to 18V) is output to the output terminal Vout, a current path to the ground is formed by the enable signal (EN) and the resistors R1, R2 generate the feedback voltage (Vpp_ref). The internal step-up voltage (VITN<0>) is generated in response to the control signal (Tbit<1>) generated by the step-up reference voltage (TISPP<0:2>). Therefore, the variable reference voltage generator 140 generates the variable reference voltage (Vref) using the step-up reference voltages (TISPP<0:2>) and the bandgap reference voltage (Vbg).

If the variable reference voltage (Vref) is differently generated according to the step-up reference voltages (TISPP<0:7>), varying factors in the resistance value of the feedback voltage (Vpp_ref) can be eliminated.

The comparator 131 compares the feedback voltage (Vpp_ref) and the variable reference voltage (Vref). If the feedback voltage (Vpp_ref) is higher than the variable reference voltage (Vref), the comparator 131 outputs a logical low. If the feedback voltage (Vpp_ref) is lower than the variable reference voltage (Vref), the comparator 131 outputs a logical high.

If the comparator 131 outputs a logical low since the feedback voltage (Vpp_ref) is higher than the variable reference voltage (Vref), the inverter IV11 inverts a logical low and outputs a logical high, thereby turning on the NMOS transistor N28. In this case, the driving node SEL is connected to the ground (VSS). Therefore, the NMOS transistor N21 is turned off and the step-up voltage level of the output terminal Vout is lowered while the voltage of the driving node SEL is discharged to the ground.

At this time, to slowly discharge the voltage of the driving node SEL to the ground (i.e., to prevent an abrupt change in the voltage level of the driving node SEL), the gates of the NMOS transistors N23 to N27 are applied with the voltage (Vbias) of less than 1V. The voltage (Vbias) of less than 1V is the lowest voltage applied to the gate of the NMOS transistor of the comparator 131 so that the NMOS transistor operates in a saturation region. A proper voltage level may be obtained through simulation.

At this time, the NAND gate ND11 performs a NAND operation on the output signal of a logical low, of the comparator 131 and the clock signal (CLK) and always outputs a logical high regardless of the voltage level of the clock signal (CLK). The inverter IV12 inverts the logical high and outputs the internal clock signal (CLK1) of a logical low, so that the high voltage switching unit 152 does not drive.

On the other hand, if the comparator 131 outputs a logical high since the feedback voltage (Vpp_ref) is lower than the variable reference voltage (Vref), the NAND gate ND11 performs a NAND operation on the output signal of a logical high, of the comparator 131 and the clock signal (CLK) and outputs a logical level depending on the voltage level of the clock signal (CLK). The inverter IV12 outputs the internal clock signal (CLK1) that is toggled, thereby driving the high voltage switching unit 152.

Therefore, the high voltage switching unit 152 pumps the high voltage (VPP) to turn on the NMOS transistor N30. The NMOS transistor N30 outputs a divided voltage (18V) as the internal step-up voltage (VINT<0>). The high voltage switching unit 152 can limit the pumping voltage level of the high voltage (VPP) using the voltage of 1.8V as a power supply voltage.

At this time, the inverter IV11 inverts the logical high and outputs a logical low, thereby turning off the NMOS transistor N28. In this case, since the driving node SEL is not connected to the ground (VSS), the NMOS transistor N30 is turned on and the voltage level of the output terminal Vout rises accordingly.

If the high voltage switching control signal (Tbit<2>) is generated by the step-up reference voltages (TISPP<5:3>), the internal step-up voltage (VINT<1>; 20V) is generated by the high voltage switching unit 153. If the control signal (Tbit<3>) is generated by the step-up reference voltage (TISPP<7:6>), the internal step-up voltage (VINT<2>; 22V) is generated by the high voltage switching unit 154. A subsequent operation is the same as that described above.

In this case, the internal step-up voltage (VINT<0>) may be within a range of 16.5V to 18V, the internal step-up voltage (VINT<1>) may range from 18.5V to 20V, and the internal step-up voltage (VINT<2>) may be in the range of 20.5V to 22V.

As described above, according to an embodiment of the present invention, a step-up voltage is internally generated using a voltage in which the step-up reference voltages (TISPP<0:7>) and the power supply voltage are dropped as a source voltage source. Accordingly, since the range of variation in the level of a step-up voltage of an output node can be limited compared with the related art, the ripple of the step-up voltage can be reduced.

Furthermore, according to an embodiment of the present invention, a variable reference voltage is generated using the step-up reference voltages (TISPP<0:7>). Varying factors of a resistance value of a feedback voltage can be eliminated and the stability can be secured accordingly.

Furthermore, according to an embodiment of the present invention, the driving node of the high voltage transfer switch is prevented from being rapidly discharged. It is possible to control variation in the step-up voltage of the output node.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A circuit for generating a step-up voltage of a non-volatile memory device, the circuit comprising:
   a high voltage transfer switch;
   a high voltage switching unit that pumps a high voltage in response to a clock signal and switches the high voltage transfer switch;
   a high voltage switching controller, which compares a feedback voltage generated by dividing an output signal of the high voltage transfer switch to a variable reference voltage, generates an internal clock signal using the comparison result and the clock signal, and controls the switching of the high voltage transfer switch in response to the comparison result; and
   a step-up voltage generator that pumps the high voltage in response to the internal clock signal and a plurality of step-up reference voltages and generates an internal step-up voltage,
   wherein the high voltage transfer switch outputs the internal step-up voltage in response to the output signal of the high voltage switching unit.

2. The circuit as claimed in claim 1, further comprising a variable reference voltage generator that generates the variable reference voltage using the plurality of step-up reference voltages and a bandgap reference voltage.

3. The circuit as claimed in claim 1, wherein the high voltage switching unit and the step-up voltage generator employ a voltage, which is enhanced greater than a power supply voltage, as a power supply in order to limit the pumping of the high voltage.

4. The circuit as claimed in claim 1, wherein the high voltage switching controller does not operate the step-up voltage generator and the high voltage transfer switch if the feedback voltage is higher than the reference voltage, and operates the step-up voltage generator and the high voltage transfer switch if the feedback voltage is lower than the reference voltage.

5. The circuit as claimed in claim 1, wherein the high voltage switching controller comprises:
   a voltage divider that divides the output signal of the high voltage transfer switch and generates the feedback voltage;
   a comparator that compares the feedback voltage and the variable reference voltage;
   a discharge unit that connects or disconnects a driving node of the high voltage transfer switch and a ground in response to an output signal of the comparator; and
   a clock generator that combines the output signal of the comparator and the clock signal to generate the internal clock signal.

6. The circuit as claimed in claim 5, wherein the discharge unit slowly discharges a voltage of the driving node to the ground using a voltage of less than 1V.

7. The circuit as claimed in claim 6, wherein the voltage of less than 1V is the lowest voltage applied to a gate of a NMOS transistor of the comparator so that the NMOS transistor operates in a saturation region.

8. The circuit as claimed in claim 1, wherein the step-up voltage generator comprises:
- a high voltage switching driver that generates high voltage switching control signals employing the plurality of step-up reference voltages;
- high voltage switching units that pump the high voltage in response to the high voltage switching control signals if the internal clock signal is toggled, and generate the internal step-up voltage;
- a high voltage divider that divides the high voltage and generates divided voltages; and
- high voltage transfer switches that selectively transfer the divided voltages output from the high voltage divider in response to output signals of the high voltage switching units, and generate the internal step-up voltage.

9. The circuit as claimed in claim 8, wherein the high voltage switching units employ a voltage, which is enhanced greater than a power supply voltage, as a power supply in order to limit the pumping of the high voltage.

* * * * *